United States Patent
Fujita et al.

(10) Patent No.: US 12,244,121 B2
(45) Date of Patent: Mar. 4, 2025

(54) QUANTUM CASCADE LASER

(71) Applicant: HAMAMATSU PHOTONICS K.K., Hamamatsu (JP)

(72) Inventors: Kazuue Fujita, Hamamatsu (JP); Masahiro Hitaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 882 days.

(21) Appl. No.: 17/214,084

(22) Filed: Mar. 26, 2021

(65) Prior Publication Data

US 2021/0305786 A1 Sep. 30, 2021

(30) Foreign Application Priority Data

Mar. 30, 2020 (JP) ................. 2020-060396

(51) Int. Cl.
| | |
|---|---|
| *H01S 5/34* | (2006.01) |
| *H01S 5/06* | (2006.01) |
| *H01S 5/10* | (2021.01) |
| *H01S 5/12* | (2021.01) |
| *H01S 5/02* | (2006.01) |

(Continued)

(52) U.S. Cl.
CPC .......... *H01S 5/3402* (2013.01); *H01S 5/0604* (2013.01); *H01S 5/1096* (2013.01); *H01S 5/1215* (2013.01); *H01S 5/0208* (2013.01); *H01S 5/04256* (2019.08); *H01S 5/2275* (2013.01); *H01S 2302/02* (2013.01)

(58) Field of Classification Search
CPC ........ H01S 5/3401–3402; H01S 5/0604–0605; H01S 5/1096
See application file for complete search history.

(56) References Cited

U.S. PATENT DOCUMENTS

| | | | | |
|---|---|---|---|---|
| 6,091,751 | A * | 7/2000 | Berger | H01S 5/3402 |
| | | | | 372/50.1 |
| 6,782,020 | B2 * | 8/2004 | Scully | B82Y 20/00 |
| | | | | 372/4 |
| 2007/0248131 | A1 | 10/2007 | Botez et al. | |

(Continued)

FOREIGN PATENT DOCUMENTS

| | | |
|---|---|---|
| JP | 2008-060396 A | 3/2008 |
| JP | 2010-521815 A | 6/2010 |
| WO | WO-2008/143737 A2 | 11/2008 |

*Primary Examiner* — Sean P Hagan

(74) *Attorney, Agent, or Firm* — Faegre Drinker Biddle & Reath LLP

(57) ABSTRACT

A QCL includes a semiconductor substrate and an active layer provided on the semiconductor substrate. The active layer has a cascade structure in which a unit laminate including a light emission layer which generates light and an injection layer to which electrons are transported from the light emission layer is laminated in multiple stages. The light emission layer and the injection layer each have a quantum well structure in which quantum well layers and barrier layers are alternately laminated. A separation layer including a separation quantum well layer having a layer thickness smaller than an average layer thickness of the quantum well layers included in the light emission layer and smaller than an average layer thickness of the quantum well layers included in the injection layer is provided between the light emission layer and the injection layer in the unit laminate.

9 Claims, 7 Drawing Sheets

(51) Int. Cl.
  *H01S 5/042*  (2006.01)
  *H01S 5/227*  (2006.01)

(56) References Cited

U.S. PATENT DOCUMENTS

| | | | |
|---|---|---|---|
| 2008/0219312 A1* | 9/2008 | Sugiyama | B82Y 20/00 |
| | | | 372/46.01 |
| 2010/0135337 A1* | 6/2010 | Belkin | B82Y 20/00 |
| | | | 372/4 |
| 2011/0026556 A1* | 2/2011 | Fujita | B82Y 20/00 |
| | | | 372/45.012 |
| 2016/0087408 A1* | 3/2016 | Fujita | H01S 5/12 |
| | | | 372/45.012 |
| 2017/0063042 A1* | 3/2017 | Yabuhara | H01S 5/3408 |
| 2017/0338627 A1* | 11/2017 | Kotani | H01S 5/3402 |

\* cited by examiner

*Fig.6*

| SEMICONDUCTOR LAYER | | COMPO-SITION | LAYER THICKNESS (nm) | DOPING |
|---|---|---|---|---|
| LIGHT EMISSION LAYER 17 | INJECTION BARRIER LAYER B1 | InAlAs | 3.9 | undoped |
| | QUANTUM WELL LAYER Q1 | InGaAs | 2.2 | undoped |
| | BARRIER LAYER B2 | InAlAs | 0.8 | undoped |
| | QUANTUM WELL LAYER Q2 | InGaAs | 6.0 | undoped |
| | BARRIER LAYER B3 | InAlAs | 0.9 | undoped |
| | QUANTUM WELL LAYER Q3 | InGaAs | 5.9 | undoped |
| | BARRIER LAYER B4 | InAlAs | 1.0 | undoped |
| | QUANTUM WELL LAYER Q4 | InGaAs | 5.2 | undoped |
| | BARRIER LAYER B5 | InAlAs | 1.3 | undoped |
| | QUANTUM WELL LAYER Q5 | InGaAs | 4.3 | undoped |
| SEPARATION LAYER 19 | SEPARATION BARRIER LAYER B6 | InAlAs | 0.7 | undoped |
| | SEPARATION QUANTUM WELL LAYER Q6 | InGaAs | 1.7 | undoped |
| | SEPARATION BARRIER LAYER B7 | InAlAs | 0.9 | undoped |
| INJECTION LAYER 18 | QUANTUM WELL LAYER Q7 | InGaAs | 3.4 | undoped |
| | BARRIER LAYER B8 | InAlAs | 1.5 | undoped |
| | QUANTUM WELL LAYER Q8 | InGaAs | 3.4 | undoped |
| | BARRIER LAYER B9 | InAlAs | 1.6 | undoped |
| | QUANTUM WELL LAYER Q9 | InGaAs | 3.4 | undoped |
| | BARRIER LAYER B10 | InAlAs | 1.9 | undoped |
| | QUANTUM WELL LAYER Q10 | InGaAs | 3.3 | Si doped:$1.0 \times 10^{17}$/cm$^3$ |
| | BARRIER LAYER B11 | InAlAs | 2.3 | Si doped:$1.0 \times 10^{17}$/cm$^3$ |
| | QUANTUM WELL LAYER Q11 | InGaAs | 3.2 | Si doped:$1.0 \times 10^{17}$/cm$^3$ |
| | BARRIER LAYER B12 | InAlAs | 2.5 | Si doped:$1.0 \times 10^{17}$/cm$^3$ |
| | QUANTUM WELL LAYER Q12 | InGaAs | 3.2 | undoped |
| | BARRIER LAYER B13 | InAlAs | 2.9 | undoped |
| | QUANTUM WELL LAYER Q13 | InGaAs | 3.1 | undoped |

QUANTUM CASCADE LASER

TECHNICAL FIELD

The present disclosure relates to a quantum cascade laser.

BACKGROUND

A quantum cascade laser (hereinafter referred to as "QCL") that generates a terahertz wave of a third frequency $\omega_3$ $(=|\omega_1-\omega_2|)$, which is a frequency difference between a first frequency $\omega_1$ and a second frequency $\omega_2$, using difference-frequency generation (DFG) is known (see, for example, Patent Document 1 (Japanese Unexamined Patent Publication No. 2010-521815)).

SUMMARY

In the QCL as described above, a pump light component of two wavelengths ($\omega_1$ and $\omega_2$), which is mid-infrared light, is generated, and a terahertz wave is generated by a non-linear optical effect (NL: non-linear mixing) and difference-frequency generation (DFG) inside the QCL. As a method having high mid-infrared-terahertz conversion efficiency (high second-order non-linear susceptibility $\chi^{(2)}$) utilizing such a technology, for example, a combined dual-upper-state (DAU) structure that is designed to sufficiently inject carriers (electrons) into both of two upper light emission levels is known. However, in the conventional DAU structure, since a threshold current density required for laser oscillation is relatively high, there is a problem in that continuous operation at room temperature is difficult.

Therefore, an objective of one aspect of the present disclosure is to provide a quantum cascade laser in which a threshold current density can be reduced.

A quantum cascade laser according to one aspect of the present disclosure includes a substrate, and an active layer provided on the substrate, in which the active layer has a cascade structure in which a unit laminate including a light emission layer which generates light and an injection layer to which electrons are transported from the light emission layer is laminated in multiple stages, the light emission layer and the injection layer each have a quantum well structure in which quantum well layers and barrier layers are alternately laminated, and a separation layer including a separation quantum well layer which is the quantum well layer having a layer thickness smaller than an average layer thickness of the quantum well layers included in the light emission layer and smaller than an average layer thickness of the quantum well layers included in the injection layer is provided between the light emission layer and the injection layer in the unit laminate.

In the quantum cascade laser described above, the separation layer is provided between the light emission layer and the injection layer in each unit laminate constituting the active layer. The separation layer includes the separation quantum well layer having a layer thickness smaller than the average layer thickness of the quantum well layers included in the light emission layer and the average layer thickness of the quantum well layers included in the injection layer. According to such a separation quantum well layer, a non-linear level that contributes to a non-linear optical effect can be formed in a subband level structure due to the quantum well structure of the unit laminate. Also, since an injection amount of carriers (electrons) from the injection layer of the unit laminate in the previous stage into the non-linear level is relatively small, the number of carriers of the non-linear level can be reduced to be small. As a result, a threshold current density required for laser oscillation in the active layer can be reduced as compared with a conventional DAU structure in which electrons are actively injected into both of two upper light emission levels.

The layer thickness of the separation quantum well layer may be smaller than a layer thickness of a first quantum well layer adjacent to the separation quantum well layer among the quantum well layers included in the light emission layer and smaller than a layer thickness of a second quantum well layer adjacent to the separation quantum well layer among the quantum well layers included in the injection layer. Also, the layer thickness of the separation quantum well layer may be ½ or less of the layer thickness of the first quantum well layer and ½ or less of the layer thickness of the second quantum well layer. According to the above-described configuration, efficiency of transporting electrons from the light emission layer to the injection layer via the separation layer can be improved. As a result, efficiency of laser oscillation can be improved.

The unit laminate may include an upper light emission level, a lower light emission level, and a non-linear level due to a ground level of the separation quantum well layer in a subband level structure due to the quantum well structure. According to the above-described configuration, improvement in the second-order non-linear susceptibility $\chi^{(2)}$ can be achieved while achieving reduction in the threshold current density by the non-linear level formed due to the ground level of the separation quantum well layer in addition to the upper light emission level and the lower light emission level.

An energy spacing between the upper light emission level and the non-linear level may be set to be smaller than an energy $E_{LO}$ of longitudinal optical phonons. According to the above-described configuration, since the non-linear level can be stably set with respect to the upper light emission level, satisfactory device characteristics can be obtained.

An anticrossing gap between a low level which is the lowest energy level in a first unit laminate, which is the unit laminate, and the upper light emission level in a second unit laminate which is the unit laminate disposed in a subsequent stage of the first unit laminate may be set to be larger than an anticrossing gap between the low level and the non-linear level in the second unit laminate. According to the above-described configuration, a current (that is, an injection amount of electrons) flowing from the injection layer of the unit laminate in the previous stage (the first unit laminate) to the upper light emission level of the unit laminate in the subsequent stage (the second unit laminate) can be sufficiently increased with respect to a current flowing from the injection layer of the first unit laminate to the non-linear level of the second unit laminate. Thereby, injection of carriers (electrons) into the non-linear level can be effectively suppressed.

The separation quantum well layer may be formed by any of the fourth to sixth quantum well layers counted from the quantum well layer at the head in the unit laminate. According to the above-described configuration, a configuration in which a wave function of the non-linear level due to the ground level of the separation quantum well layer does not reach the barrier layer (injection barrier) at the head in the light emission layer can be preferably realized. Thereby, injection of electrons from the injection layer of the unit laminate in the previous stage to the non-linear level of the unit laminate in the subsequent stage can be effectively suppressed.

The unit laminate may be configured to generate light having a first frequency $\omega_1$ and light having a second frequency $\omega_2$ which are mid-infrared light and a terahertz wave having a difference frequency $\omega_{THz}$ between the first frequency co and the second frequency $\omega_2$ using a double resonant process in which the upper light emission level, the lower light emission level, and the non-linear level resonate. According to the above-described configuration, a terahertz wave can be generated with a relatively high mid-infrared-terahertz conversion efficiency (the second-order non-linear susceptibility $\chi^{(2)}$) while achieving reduction in threshold current density by forming the non-linear level described above.

The separation layer may include separation barrier layers which are the barrier layers disposed on both sides of the separation quantum well layer in a lamination direction of the unit laminate, and layer thicknesses of the separation barrier layers may each be smaller than an average layer thickness of the barrier layers included in the light emission layer and an average layer thickness of the barrier layers included in the injection layer. According to the above-described configuration, efficiency of transporting electrons from the light emission layer to the injection layer via the separation layer can be further improved.

The separation layer may include the separation barrier layers which are the barrier layers disposed on both sides of the separation quantum well layer in the lamination direction of the unit laminate, and layer thicknesses of the separation barrier layers may each be smaller than a layer thickness of a first barrier layer adjacent to the separation barrier layers among the barrier layers included in the light emission layer and a layer thickness of a second barrier layer adjacent to the separation barrier layers among the barrier layers included in the injection layer.

According to the above-described configuration, efficiency of transporting electrons from the light emission layer to the injection layer via the separation layer can be further improved.

According to one aspect of the present disclosure, it is possible to provide a quantum cascade laser in which a threshold current density can be reduced.

BRIEF DESCRIPTION OF THE DRAWINGS

FIG. 6 is a chart showing an example of a structure of the unit laminate for one cycle in the active layer.

DETAILED DESCRIPTION

Figure 1:
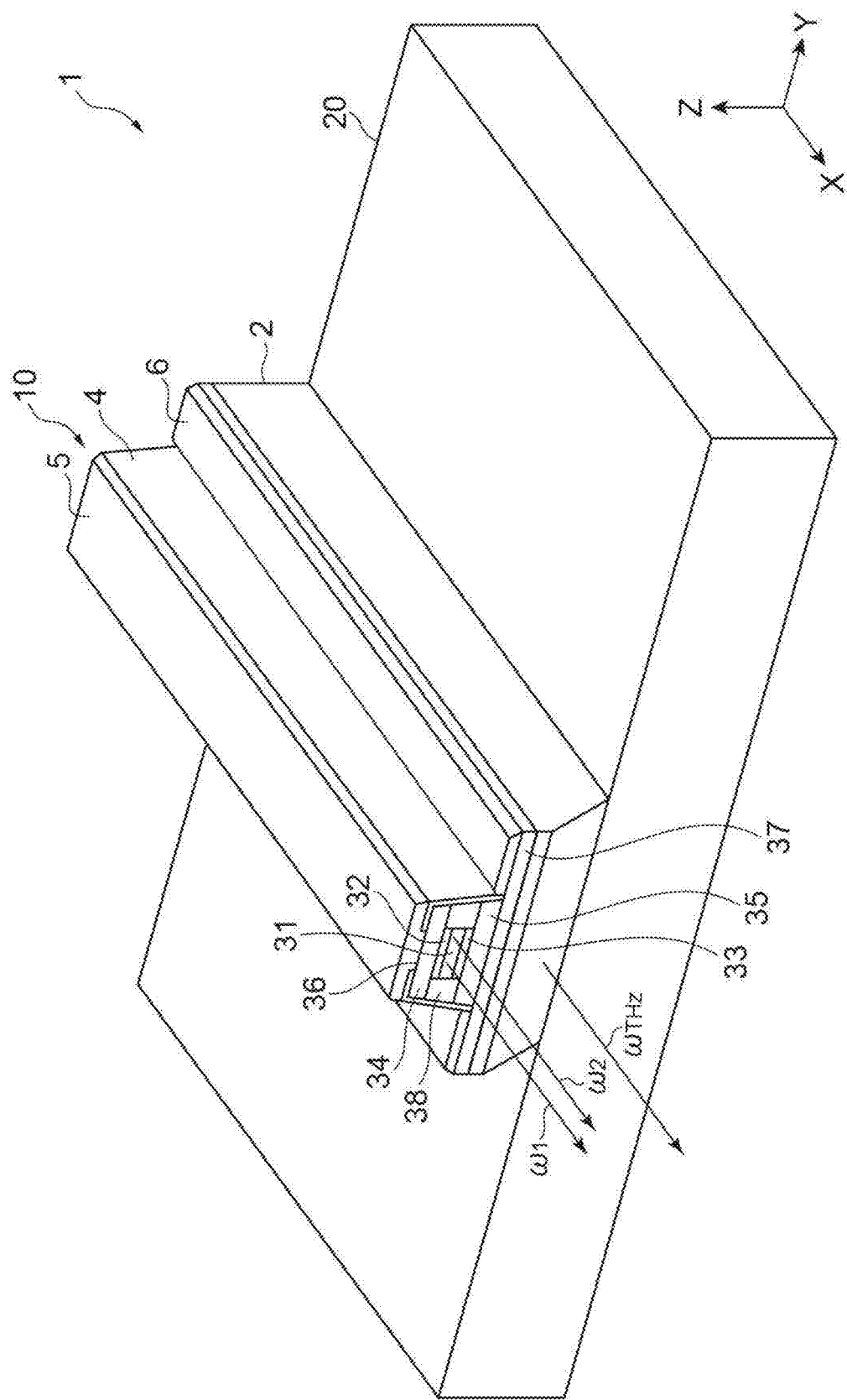
FIG. 1 is a perspective view of a laser module including a quantum cascade laser according to one embodiment.

Hereinafter, an embodiment of the present disclosure will be described in detail with reference to the drawings. In the description of the drawings, elements which are the same will be denoted by the same reference signs and duplicate description thereof will be omitted. Further, dimensional proportions in the drawings do not necessarily coincide with the description used in the specification.

As illustrated in FIG. 1, a laser module 1 includes a quantum cascade laser (hereinafter referred to as "QCL") 10 and a sub-mount 20 on which the QCL 10 is placed. The QCL 10 is a laser device of a monopolar type which generates light utilizing an inter-subband electron transition in a semiconductor quantum well structure. The sub-mount 20 is a ceramic substrate configured to include, for example, aluminum nitride (AlN).

[Configuration of Quantum Cascade Laser]

Figure 2:
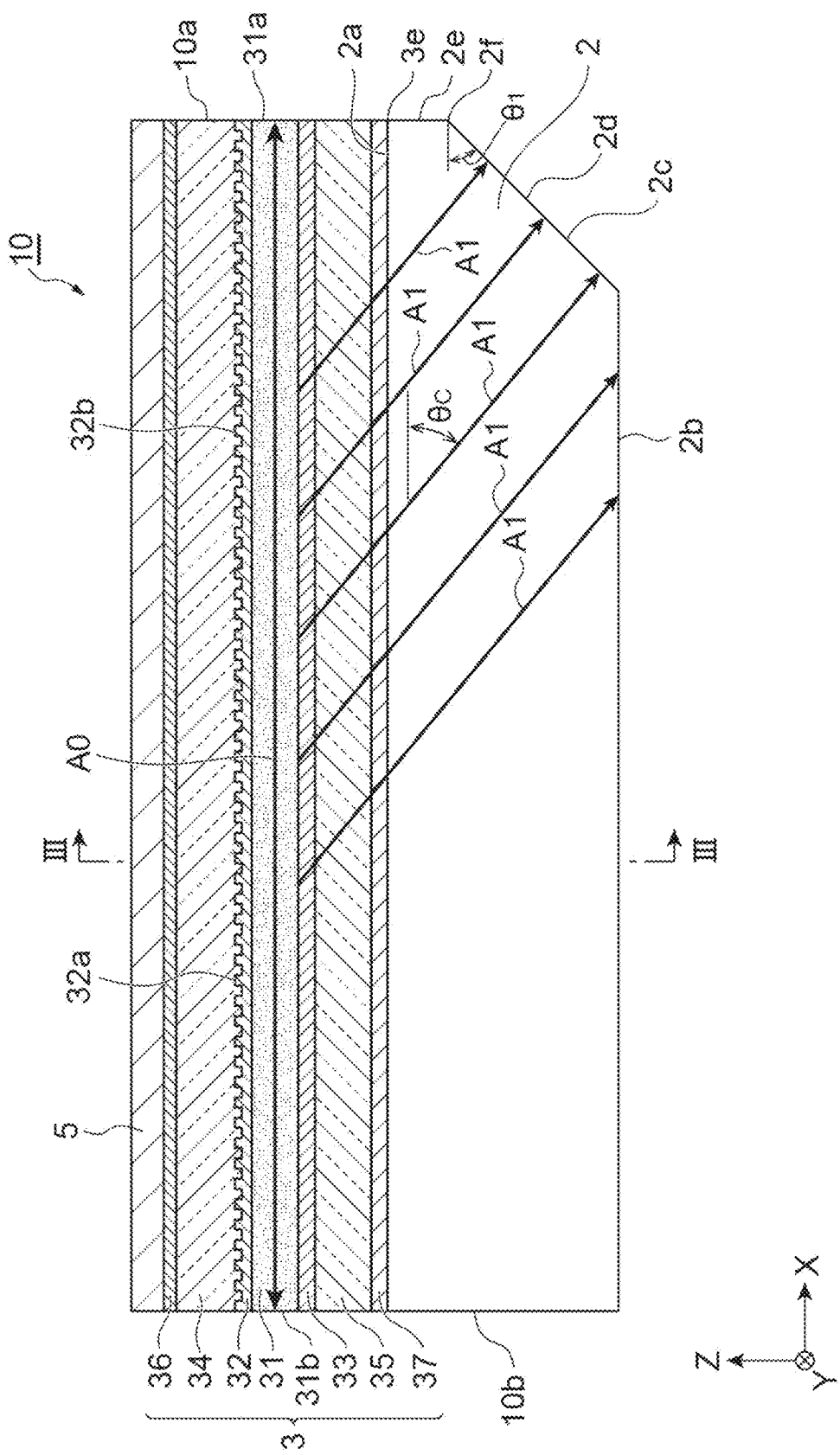
FIG. 2 is a cross-sectional view of the quantum cascade laser.

The QCL 10 may be configured as, for example, a terahertz light source that can output a terahertz wave in a room temperature environment. As illustrated in FIG. 2, the QCL 10 includes a first end surface 10a and a second end surface 10b facing each other in one direction (positioned on opposite sides from each other). The QCL 10 is configured to emit light (in the present embodiment, light having a first frequency $\omega_1$ and light having a second frequency $\omega_2$ ($<\omega_1$)) in a mid-infrared region (for example, 3 μm or more and 20 μm or less) from each of the first end surface 10a and the second end surface 10b (specifically, an end surface 31a and an end surface 31b of an active layer 31 to be described below). In the present specification, for the sake of convenience, a direction in which the first end surface 10a and the second end surface 10b face each other (that is, direction in an emission direction of the above-described light) is referred to as an X-axis direction, a thickness direction of the QCL 10 (that is, a lamination direction of a semiconductor layer 3 to be described below) is referred to as a Z-axis direction, and a width direction of the QCL 10 (that is, a direction perpendicular to both the X-axis direction and the Z-axis direction) is referred to as a Y-axis direction.

Figure 3:
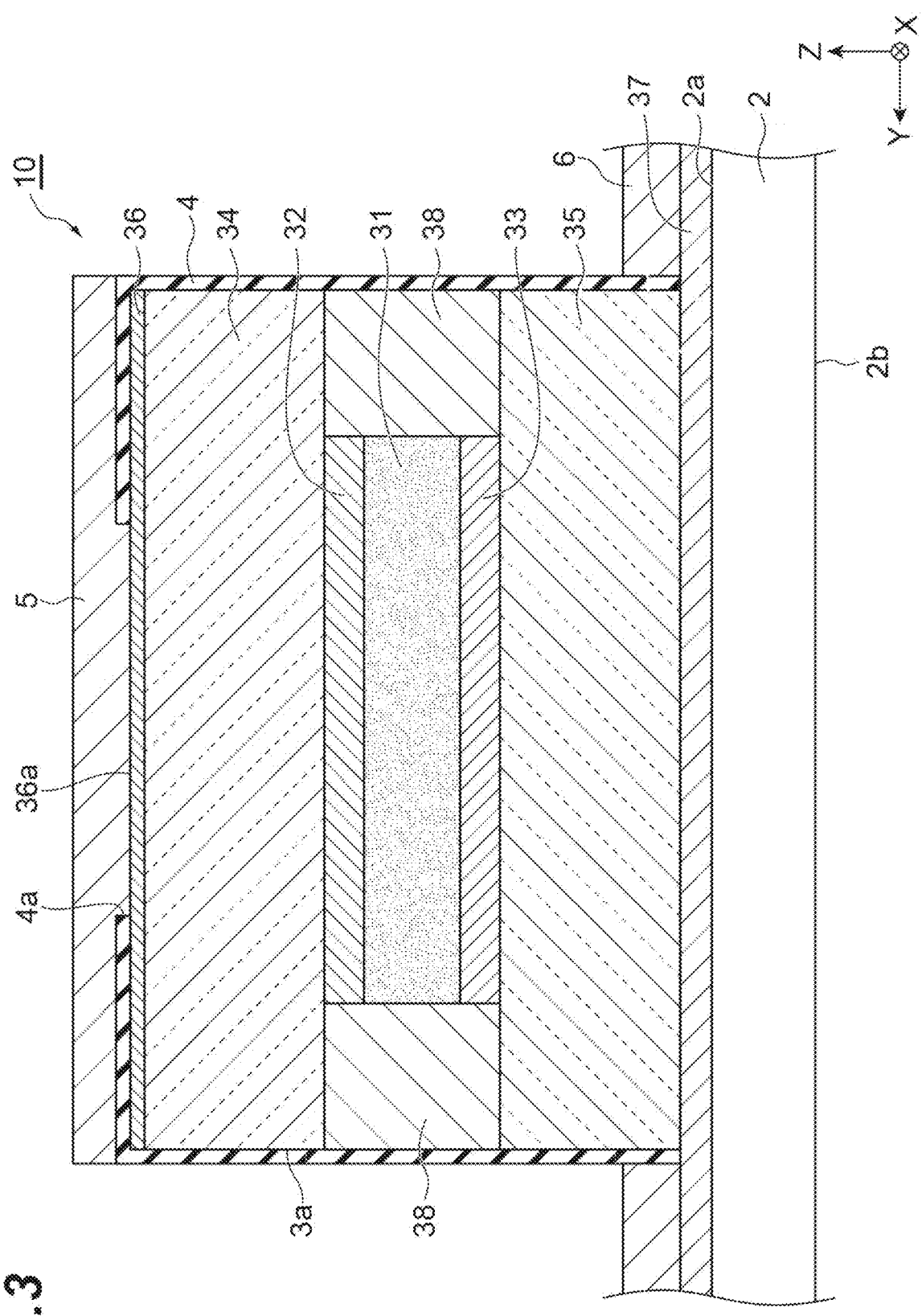
FIG. 3 is a cross-sectional view of the quantum cascade laser along line III-III of FIG. 2.

As illustrated in FIGS. 1 to 3, the QCL 10 includes a semiconductor substrate 2, the semiconductor layer 3, an insulating film 4, an upper electrode 5, and a lower electrode 6. Further, FIG. 2 is a cross-sectional view along an XZ plane at a central portion of the QCL 10 in the width direction. The semiconductor substrate 2 may be, for example, a rectangular plate-shaped InP single crystal substrate (semi-insulating substrate: high-resistance semiconductor substrate doped with Fe). The semiconductor substrate 2 includes a main surface 2a on which the semiconductor layer 3 is provided, and a back surface 2b on a side opposite to the main surface 2a. The main surface 2a and the back surface 2b are flat surfaces perpendicular to the Z-axis direction, and the back surface 2b is placed on the sub-mount 20. A length of the semiconductor substrate 2 (length in the X-axis direction) may be, for example, hundreds of micrometers to several millimeters. A width of the semiconductor substrate 2 (length in the Y-axis direction) may be, for example, hundreds of micrometers to several millimeters. A thickness of the semiconductor substrate 2 (length in the Z-axis direction) may be, for example, hundreds of micrometers.

The semiconductor substrate 2 includes a side surface 2c connecting the main surface 2a and the back surface 2b as a part of the first end surface 10a of the QCL 10. The side surface 2c includes a first surface 2d and a second surface 2e. The first surface 2d is a flat surface connected to the back surface 2b and extending from the back surface 2b to the main surface 2a side. The first surface 2d is inclined with respect to the main surface 2a and the back surface 2b to become further away from the second end surface 10b as it goes from the back surface 2b toward the main surface 2a side. An angle $\theta_1$ formed by the first surface 2d and the main surface 2a may be, for example, about 30° to 80°. The first surface 2d may be, for example, a polished surface formed by polishing a corner portion of the semiconductor substrate that is originally formed in a rectangular plate shape. The second surface 2e is a flat surface that connects an end portion of the first surface 2d on the main surface 2a side and the main surface 2a. The second surface 2e is inclined with respect to the first surface 2d. The second surface 2e is substantially perpendicular to the main surface 2a and the back surface 2b.

In the vicinity of a corner portion 2f formed between the first surface 2d and the second surface 2e, a terahertz wave component transmitted from the active layer 31 toward an interface of the QCL 10 and a terahertz wave component reflected at the interface reinforce each other. Therefore, for example, when the corner portion 2f is disposed close to a lens surface of a lens (not illustrated), the terahertz wave can be efficiently transmitted to the inside of the lens, and extraction efficiency of the terahertz wave can be improved.

The semiconductor layer 3 is provided on the main surface 2a of the semiconductor substrate 2. A thickness of the semiconductor layer 3 is about 10 μm to 20 μm. The semiconductor layer 3 includes the active layer 31, an upper guide layer 32, a lower guide layer 33, an upper clad layer 34, a lower clad layer 35, an upper contact layer 36, a lower contact layer 37, and a support layer 38. The lower contact layer 37, the lower clad layer 35, the lower guide layer 33, the active layer 31, the upper guide layer 32, the upper clad layer 34, and the upper contact layer 36 are laminated in that order from the main surface 2a side of the semiconductor substrate 2. The support layer 38 is provided between the lower clad layer 35 and the upper clad layer 34 on both sides (both sides in the Y-axis direction) of the active layer 31, the upper guide layer 32, and the lower guide layer 33 which are formed in a ridge stripe shape. Further, the lower contact layer 37 includes a portion extending outward (outward in the Y-axis direction) from the lower clad layer 35 laminated on the lower contact layer 37.

The lower contact layer 37 may be, for example, a high-concentration Si-doped InGaAs layer (Si: $1.0 \times 10^{18}/cm^3$) having a thickness of about 200 nm. The lower clad layer 35 may be, for example, a Si-doped InP layer (Si: $1.5 \times 10^{16}/cm^3$) having a thickness of about 5 μm. The lower guide layer 33 may be, for example, a Si-doped InGaAs layer (Si: $1.5 \times 10^{16}/cm^3$) having a thickness of about 250 nm. The active layer 31 is a layer in which a quantum cascade structure is formed. Details of a layer structure of the active layer 31 will be described below.

The upper guide layer 32 may be, for example, a Si-doped InGaAs layer (Si: $1.5 \times 10^{16}/cm^3$) having a thickness of about 350 nm. In the upper guide layer 32, a diffraction grating structure that functions as a distributed feedback (DFB) structure is formed in a resonance direction A0 of first pump light and second pump light (details will be described below). The upper guide layer 32 includes diffraction grating layers 32a and 32b provided in parallel in the resonance direction A0 as the diffraction grating structure. The diffraction grating layer 32a oscillates the first pump light in a single mode. The diffraction grating layer 32b oscillates the second pump light in a single mode. In the present embodiment, the resonance direction A0 is a direction parallel to the X-axis direction.

The upper clad layer 34 may be, for example, a Si-doped InP layer (Si: $1.5 \times 10^{16}/cm^3$) having a thickness of about 5 μm. The upper contact layer 36 may be, for example, a high-concentration Si-doped InP layer (Si: $1.5 \times 10^{18}/cm^3$) having a thickness of about 15 nm. The support layer 38 may be, for example, an Fe-doped InP layer.

As illustrated in FIG. 3, the insulating film 4 is formed to cover an upper surface 36a of the upper contact layer 36 and a side surface 3a of the semiconductor layer 3 intersecting the Y-axis direction. A contact hole 4a for exposing a part of the upper surface 36a of the upper contact layer 36 is formed in the insulating film 4. The contact hole 4a extends in the X-axis direction to expose a central portion of the upper surface 36a in the Y-axis direction. The insulating film 4 may be formed of, for example, SiN. The upper electrode 5 is formed on the upper surface 36a of the upper contact layer 36. The upper electrode 5 is electrically connected to a part of the upper surface 36a of the upper contact layer 36 via the contact hole 4a. The lower electrode 6 is formed on a portion of the lower contact layer 37 extending outward in the Y-axis direction from the lower clad layer 35 and is electrically connected to the lower contact layer 37. Thereby, when a current is caused to flow from the lower electrode 6 to the upper electrode 5, the QCL 10 can be driven.

[Configuration of Active Layer]

The active layer 31 is configured to generate the first pump light having the first frequency $\omega_1$ and the second pump light having the second frequency $\omega_2$ due to intersubband luminescence transition of electrons and generate a terahertz wave having a difference frequency $\omega_{THz}$ ($=|\omega_1 - \omega_2|$) between the first frequency $\omega_1$ and the second frequency $\omega_2$ using difference-frequency generation (DFG) caused by Cherenkov phase matching.

The active layer 31 includes the end surface 31a and the end surface 31b on a side opposite to the end surface 31a. The end surface 31a and the end surface 31b are planes intersecting the X-axis direction. The end surface 31a is a part of the first end surface 10a of the QCL 10, and the end surface 31b is a part of the second end surface 10b of the QCL 10. The end surface 31a and the end surface 31b constitute a resonator that oscillates the first pump light and the second pump light.

Figure 4:
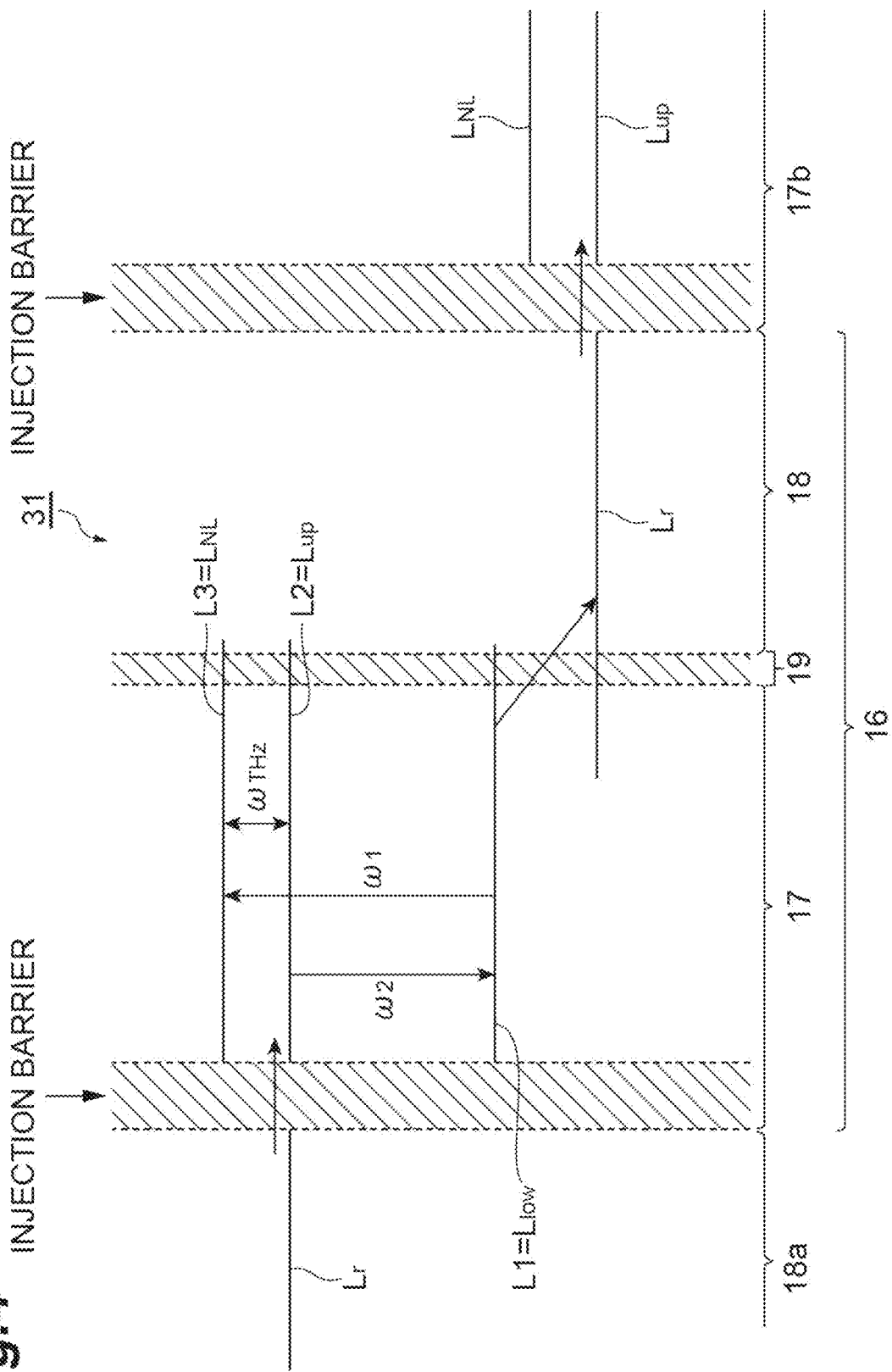
FIG. 4 is a diagram showing an example of a subband level structure in an active layer of the quantum cascade laser.

As illustrated in FIG. 4, the active layer 31 has a cascade structure formed by laminating a unit laminate 16 in multiple stages. The unit laminate 16 includes a light emission layer 17 that generates light, and an injection layer 18 to which electrons are transported from the light emission layer 17. The light emission layer 17 is a portion that mainly exhibits a light emitting function for generating light. The injection layer 18 is a portion that mainly exhibits an electron transport function of injecting electrons of the light emission layer 17 into an upper light emission level of the light emission layer 17 of the unit laminate 16 in the subsequent stage. The light emission layer 17 and the injection layer 18 each have a quantum well structure in which quantum well layers and barrier layers are alternately laminated. Thereby, a subband level structure, which is an energy level structure due to the quantum well structure, is formed in each unit laminate 16.

The unit laminate 16 has an upper light emission level (second level) $L_{up}=L_2$ and a non-linear level (third level) $L_{NL}=L_3$ having a higher energy than the upper light emission level in the subband level structure. Also, the unit laminate 16 has a lower light emission level (first level) $L_{low}=L_1$ having a lower energy than the upper light emission level $L_{up}$ and a relaxation level $L_r$ having a lower energy than the lower light emission level $L_{low}$ in the subband level structure.

An injection barrier layer for electrons injected from the injection layer 18a into the light emission layer 17 is provided between the light emission layer 17 and an injection layer 18a of a unit laminate of the previous stage. A separation layer 19 that is thin enough for wave functions to penetrate is provided between the light emission layer 17 and the injection layer 18. That is, the light emission layer 17 and the injection layer 18 are separated by the separation layer 19. The separation layer 19 includes a quantum well layer (separation quantum well layer) and a pair of barrier layers (separation barrier layers) sandwiching the quantum well layer. As described above, the separation layer 19 is provided in the active layer 31 instead of an exit barrier layer (one barrier layer) that may be provided in a conventional QCL active layer structure.

A spacing configuration of each level in the subband level structure of the unit laminate 16 is as follows. An energy spacing $\Delta E_{21}$ between the upper light emission level $L_{up}$ and the lower light emission level $L_{low}$ substantially coincides with an energy $E_2$ of the pump light having the second frequency $\omega_2$. An energy spacing $\Delta E_{31}$ between the non-linear level $L_{NL}$ and the lower light emission level $L_{low}$ substantially coincides with an energy $E_1$ of the pump light having the first frequency $\omega_1$. An energy spacing $\Delta E_{32}$ between the upper light emission level $L_{up}$ and the non-linear level $L_{NL}$ substantially coincides with an energy $E$ ($=E_1-E_2$) of a terahertz wave having the difference frequency $\omega_{THz}$ between the first frequency $\omega 1$ and the second frequency $\omega_2$.

In the subband level structure described above, electrons are injected into the light emission layer 17 from the relaxation level Lr of the injection layer 18a of the previous stage via the injection barrier. Thereby, the upper light emission level $L_{up}$ that is coupled to the relaxation level Lr is strongly excited. Here, in a conventional DAU structure, carriers (electrons) are set to be actively injected into both of two upper light emission levels. On the other hand, in the subband level structure of the active layer 31, of the two energy levels on the upper side (the upper light emission level $L_{up}$ and the non-linear level $L_{NL}$), electrons are actively injected into the upper light emission level $L_{up}$, whereas an injection amount of electrons into the non-linear level $L_{NL}$ is set to be relatively small. That is, the subband level structure of the active layer 31 is configured such that a sufficient amount of electrons are injected only into the upper light emission level $L_{up}$ while a sufficient amount of electrons are injected into both of the two upper light emission levels in the conventional DAU structure. That is, in the subband level structure of the active layer 31, the non-linear level $L_{NL}$ is set to mainly contribute only to a non-linear optical effect.

In the active layer 31, for example, when the difference frequency $\omega_{THz}$ is about 2 THz or more, the terahertz wave having the difference frequency $\omega_{THz}$ is generated by a non-linear process called a double resonant process in which the upper light emission level $L_{up}$, the lower light emission level $L_{low}$, and the non-linear level $L_{NL}$ resonate. For example, when the second pump light having the second frequency $\omega_2$ corresponding to electron transition between the upper light emission level $L_{up}$ and the lower light emission level $L_{low}$ is incident on the active layer 31 and the first pump light having the first frequency $\omega_1$ corresponding to electron transition between the non-linear level $L_{NL}$ and the lower light emission level $L_{low}$ is incident on the active layer 31, the terahertz wave having the difference frequency $\omega_{THz}$ corresponding to electron transition between the upper light emission level $L_{up}$ and the non-linear level $L_{NL}$ is generated and emitted.

As illustrated in the following expressions (1) and (2), power $W(\omega)$ of light having a difference frequency $\omega$ generated due to the above-described non-resonant process is proportional to power $W(\omega_1)$ and $W(\omega_2)$ of mid-infrared pump light of the first frequency $\omega_1$ and the second frequency $\omega_2$ and to the square of a coherence length $l_{coh}$, and a non-linear susceptibility $\chi^{(2)}$ is proportional to a dipole moment $z_{nm}$ of transition.

$$W(\omega = \omega_1 - \omega_2) \propto |\chi^{(2)}|^2 \times W(\omega_1)W(\omega_2) \times l_{coh}^2 \qquad (1)$$

$$\chi^{(2)} \approx \Delta N \frac{e^3}{\hbar^2 \varepsilon_0} \times \left( \frac{-z_{32}z_{31}z_{21}}{(\omega_{THz} - \omega_{32} + i\Gamma_{32})(\omega_1 - \omega_{31} + i\Gamma_{31})} + \frac{-z_{32}z_{31}z_{21}}{(\omega_{THz} - \omega_{32} + i\Gamma_{32})(-\omega_2 - \omega_{21} + i\Gamma_{21})} \right) \qquad (2)$$

Here, in the above expression, e indicates an electric charge, h bar (h with a bar attached) indicates a Dirac constant, $\Delta N$ indicates the number of population inversions, and $\Gamma_{nm}$ indicates a light emission half-value width of each transition. As illustrated in the above expression (2), the second-order non-linear susceptibility $\chi^{(2)}$ between the three levels is expressed by a product of dipole moments at the corresponding transitions.

Electrons that have transitioned to the lower light emission level $L_{low}$ are relaxed to the relaxation level $L_r$. When electrons are pulled out from the lower light emission level $L_{low}$ in this way, population inversion for realizing laser oscillation is formed between the upper light emission level $L_{up}$, the non-linear level $L_{NL}$, and the lower light emission level $L_{low}$. The electrons relaxed to the relaxation level $L_r$ are injected into the upper light emission level $L_{up}$ of a light emission layer 17b in the subsequent stage in a cascade manner via the injection layer 18. Further, the relaxation level Lr is not limited to one configured by only one level and may be one configured by a plurality of levels or may be one configured by a mini band.

When the electron injection, the electron luminescence transition, and the electron relaxation as described above are repeated in a plurality of unit laminates 16 constituting the active layer 31, light generation in a cascade manner occurs in the active layer 31. When electrons move in the plurality of unit laminates 16 in a cascade manner, the first pump light having the first frequency $\omega_1$ and the second pump light having the second frequency $\omega_2$ are generated due to the luminescence transition between subbands of electrons in each of the unit laminates 16. Then, the terahertz wave having the difference frequency $\omega_{THz}$ ($=|\omega_1-\omega_2|$) between the first frequency $\omega_1$ and the second frequency $\omega_2$ is generated by the difference-frequency generation due to Cherenkov phase matching.

Figure 5:
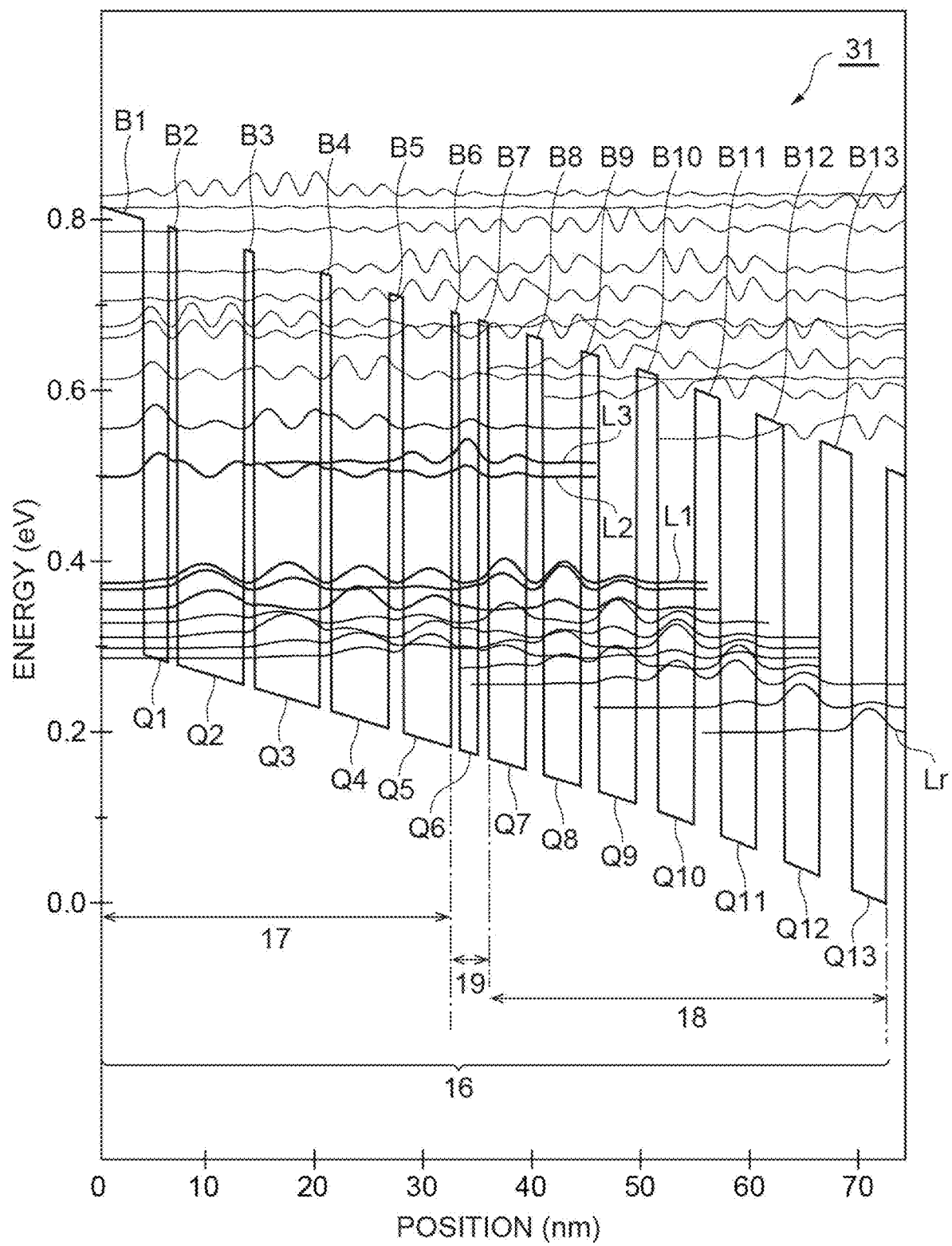
FIG. 5 is a diagram showing an example of a configuration of a unit laminate constituting the active layer.

The configuration of the active layer 31 will be further described. The subband level structure illustrated in FIGS. 5 and 6 is an example of the active layer structure constituting the subband level structure illustrated in FIG. 4. Further, FIG. 5 shows quantum well structures and subband level structures in an operating electric field thereof for a part of the repeated structure of the light emission layers 17 and the injection layers 18. In the present configuration example, a design value of the first frequency $\omega_1$ is 930 cm$^{-1}$, and a design value of the second frequency $\omega_2$ is 1000 cm$^{-1}$. Also, a design value of the energy spacing $\Delta E_{32}$ between the upper light emission level $L_{up}$ and the non-linear level $L_{NL}$ is 16 meV, a design value of the energy spacing $\Delta E_{21}$ between the upper light emission level $L_{up}$ and the lower light emission level $L_{low}$ is 126 meV, and a center wavelength of a gain of the active layer 31 is set to about 10 μm. A design value of the energy spacing $\Delta E_{31}$ between the non-linear level $L_{NL}$ and the lower light emission level $L_{low}$ is 142 meV. Also, the active layer 31 is formed such that the unit laminate 16 is laminated for, for example, 50 cycles.

In the active layer 31, in order to realize generation of a terahertz wave using the difference-frequency generation, it is necessary to be able to generate a pump light component having two wavelengths and to have a high second-order non-linear susceptibility $\chi^{(2)}$ for the pump light component having two wavelengths. In the present configuration example, by providing the upper guide layer 32 with two types of the diffraction grating layers 32a and 32b, generation of the first pump light having the first frequency $\omega_1$ and the second pump light having the second frequency $\omega_2$ and generation of the terahertz wave having the difference frequency $\omega_{THz}$ are realized with a single active layer design.

In the present configuration example, when carrier concentrations of the lower light emission level $L_1$, the upper light emission level $L_2$, and the non-linear level $L_3$ are each expressed as $n_1$ to $n_3$ and it is assumed that "$n_1=n_3$," a carrier density at each subband level is "$n_2-n_1=1.0\times10^{15}/cm^3$" and "$n_3-n_1=0.3\times10^{15}/cm^3$." Such a carrier density is derived from analysis using the nonequilibrium Green function. From the carrier density derived in this way, an absolute value of a sum of the second-order non-linear susceptibility $\chi^{(2)}$ generated by the present configuration example is calculated as "$|\chi^{(2)}|=15$ nm/V" when a design frequency (that is, the frequency $\omega_{THz}$ of the terahertz wave) is set to 2 THz.

The design frequency $\omega_{THz}$, the first frequency $\omega_1$ and the second frequency $\omega_2$ are determined by the DFB structure (in the present embodiment, the diffraction grating structure formed in the upper guide layer 32). A frequency of the terahertz wave that can be finally obtained is determined by "$\omega_{THz}=\omega_1-\omega_2$." In the present configuration example, the design frequency $\omega_{THz}$ is set to 2 THz. Also, in the active layer 31, the first frequency $\omega_1$ and the second frequency $\omega_2$ are both operated in a single mode to operate the terahertz wave in the single mode using the DFB structure having two cycles.

As illustrated in FIGS. 5 and 6, the unit laminate 16 for one cycle is formed as a quantum well structure in which 13 quantum well layers Q1 to Q13 and 13 barrier layers B1 to B13 are alternately laminated. The quantum well layers Q1 to Q13 may be, for example, InGaAs layers, and the barrier layers B1 to B13 may be, for example, InAlAs layers.

In each unit laminate 16, a portion in which five quantum well layers Q1 to Q5 from the unit laminate 16 side of the previous stage and five barrier layers B1 to B5 from the unit laminate 16 side of the previous stage are alternately laminated mainly constitutes the light emission layer 17 having the light emitting function. Also, a portion in which seven quantum well layers Q7 to Q13 from the unit laminate 16 side of the subsequent stage and six barrier layers B8 to B13 from the unit laminate 16 side of the subsequent stage are alternately laminated mainly constitutes the injection layer 18 having the electron transport function. Also, the first-stage barrier layer B1 of the light emission layer 17 functions as the injection barrier layer.

The separation layer 19 is provided between the light emission layer 17 and the injection layer 18 in each unit laminate 16. The separation layer 19 is constituted by a separation quantum well layer Q6 which is one quantum well layer and separation barrier layers B6 and B7 which are two barrier layers disposed on both sides of the separation quantum well layer Q6 in the lamination direction (that is, the Z-axis direction) of the unit laminate 16.

A layer thickness of the separation quantum well layer Q6 is set to be sufficiently small to such an extent that transport of electrons from the light emission layer 17 to the injection layer 18 is not hindered. Specifically, the layer thickness of the separation quantum well layer Q6 (1.7 nm in the present configuration example) is smaller than an average layer thickness of the quantum well layers Q1 to Q5 (about 4.7 nm in the present configuration example) included in the light emission layer 17 and smaller than an average layer thickness of the quantum well layers Q7 to Q13 (about 3.3 nm in the present configuration example) included in the injection layer 18.

Also, in the present configuration example, the layer thickness (1.7 nm) of the separation quantum well layer Q6 is smaller than a layer thickness (4.3 nm in the present configuration example) of the quantum well layer Q5 (first quantum well layer) adjacent to the separation quantum well layer Q6 among the quantum well layers Q1 to Q5 included in the light emission layer 17 and smaller than a layer thickness (3.4 nm in the present configuration example) of the quantum well layer Q7 (second quantum well layer) adjacent to the separation quantum well layer Q6 among the quantum well layers Q7 to Q13 included in the injection layer 18. In the present configuration example, the layer thickness of the separation quantum well layer Q6 is set to be the smallest among the quantum well layers Q1 to Q13 included in the unit laminate 16. Further, the layer thickness of the separation quantum well layer Q6 is ½ or less of the layer thickness of the quantum well layer Q5 and ½ or less of the layer thickness of the quantum well layer Q7. According to the above-described configuration, efficiency of transporting electrons from the light emission layer 17 to the injection layer 18 via the separation layer 19 can be improved. That is, when the layer thickness of the separation quantum well layer Q6 is made sufficiently small, transport of electrons from the light emission layer 17 to the injection layer 18 can be prevented from being hindered. As a result, efficiency of laser oscillation can be improved.

Similarly, layer thicknesses of the separation barrier layers B6 and B7 are set to be sufficiently small to such an extent that transport of electrons from the light emission layer 17 to the injection layer 18 is not hindered. Specifically, the layer thickness of the separation barrier layer B6 (0.7 nm in the present configuration example) and the layer thickness of the separation barrier layer B7 (0.9 nm in the present configuration example) are each smaller than an average layer thickness of the barrier layers B1 to B5 (about 1.6 nm in the present configuration example) included in the light emission layer 17 and an average layer thickness of the barrier layers B8 to B13 (about 2.1 nm in the present configuration example) included in the injection layer 18. Also, the layer thicknesses of the separation barrier layers B6 and B7 are each smaller than a layer thickness (1.3 nm in the present configuration example) of the barrier layer B5 (first barrier layer) adjacent to the separation barrier layer B6 among the barrier layers B1 to B5 included in the light emission layer 17 and a layer thickness (1.5 nm in the present configuration example) of the barrier layer B8 (second barrier layer) adjacent to the separation barrier layer B7 among the barrier layers B8 to B13 included in the injection layer 18. According to the above-described configuration, when the layer thicknesses of the separation barrier layers B6 and B7 are made sufficiently small, transport of electrons from the light emission layer 17 to the injection layer 18 can be prevented from being hindered. Thereby, the efficiency of transporting electrons from the light emission layer 17 to the injection layer 18 via the separation layer 19 can be further improved.

In each unit laminate 16, the energy spacing $\Delta E_{32}$ between the upper light emission level $L_{up}$ and the non-linear level $L_{NL}$ is set to be smaller than an energy $E_{LO}$ of longitudinal optical phonon. Specifically, in the present configuration example, the condition of the following expression (3) is satisfied. When it is assumed that the condition of expression (3) is not satisfied, a level positioned on a higher energy level side (the non-linear level $L_{NL}$ in the present configuration example) between the upper light emission level $L_{up}$ and the non-linear level $L_{NL}$ is relaxed to a level on a lower energy side (the upper light emission level $L_{up}$ in the present configuration example) at high speed due to longitudinal optical phonon scattering, resulting in a level structure different from that of the present configuration example. As a result, it is difficult to obtain satisfactory device characteristics (that is, a threshold current density, a second-order non-linear susceptibility, or the like that can be obtained by the present configuration example). On the other hand, when the condition of expression (3) is satisfied, since the non-linear level $L_{NL}$ can be stably set with respect to the upper light emission level $L_{up}$, satisfactory device characteristics can be obtained.

$$E_{32} < E_{LO} = 34 \text{ meV}(\text{In}_{0.52}\text{Ga}_{0.48}\text{As}) \qquad (3)$$

In the present configuration example, an anticrossing gap (energy gap of anticrossing) between the relaxation level $L_r$ (low level) which is the lowest energy level (ground level) in the unit laminate 16 on a previous stage side (hereinafter referred to as "first unit laminate") and the upper light emission level $L_{up}$ in the unit laminate 16 disposed in a subsequent stage of the first unit laminate (hereinafter referred to as "second unit laminate") is set to be larger than an anticrossing gap between the relaxation level $L_r$ in the first unit laminate and the non-linear level $L_{NL}$ in the second unit laminate. In the present configuration example, an anticrossing gap between the relaxation level $L_r$ in the first unit laminate and the upper light emission level $L_{up}$ in the second unit laminate is 6.8 meV, and the anticrossing gap between the relaxation level $L_r$ in the first unit laminate and the non-linear level $L_{NL}$ in the second unit laminate is 5.0 meV. Here, a current value flowing from the relaxation level $L_r$ in the first unit laminate to each level in the second unit laminate is proportional to the square of the anticrossing gap. Therefore, in the present configuration example, in each unit laminate 16, a magnitude of a current value flowing to the upper light emission level $L_{up}$ is 1.84 times a current value flowing to the non-linear level $L_{NL}$. As described above, an injection amount of electrons from the injection layer 18 (for example, the relaxation level $L_r$) of the unit laminate 16 in the previous stage to the non-linear level $L_{NL}$ is relatively small. That is, an electron density and the number of electrons of the non-linear level $L_{NL}$ are much smaller than an electron density and the number of electrons of the upper light emission level $L_{up}$. In other words, when the anticrossing gap is set as described above, a current (that is, injection amount of electrons) flowing from the injection layer 18 of the unit laminate 16 in the previous stage (the first unit laminate) to the upper light emission level $L_{up}$ of the unit laminate 16 in the subsequent stage (the second unit laminate) can be sufficiently increased with respect to a current flowing from the injection layer 18 of the first unit laminate to the non-linear level $L_{NL}$ of the second unit laminate. Thereby, injection of carriers (electrons) into the non-linear level $L_{NL}$ can be effectively suppressed.

As described above, the non-linear level $L_{NL}$ is mainly formed by the separation quantum well layer Q6. Specifically, the non-linear level $L_{NL}$ is a level caused by a ground level of the separation quantum well layer Q6. That is, a center of a wave function of the non-linear level La is positioned in the separation quantum well layer Q6. Also, the separation quantum well layer Q6 is provided at a position separated to some extent from the unit laminate 16 in the previous stage. That is, the wave function of the non-linear level $L_{NL}$ is effectively set not to reach the injection barrier layer B1 of the light emission layer 17. Improvement in the second-order non-linear susceptibility $\chi^{(2)}$ can be achieved while achieving reduction in the threshold current density by the non-linear level $L_{NL}$ formed due to the ground level of the separation quantum well layer Q6 as described above in addition to the upper light emission level $L_{up}$ and the lower light emission level $L_{low}$. Specifically, the above-described effect can be achieved by forming the non-linear level $L_{NL}$ to which an injection amount of electrons is suppressed and which contributes to the non-linear optical effect (in the present configuration example, contributes to the difference-frequency generation due to the double resonant process).

Also, in the present configuration example, the separation quantum well layer Q6 is formed by any of the fourth to sixth quantum well layers (sixth one in the present configuration example) counted from the quantum well layer Q1 at the head in the unit laminate 16. In other words, the separation layer 19 is provided at a position separated to some extent from the injection layer 18 of the unit laminate 16 in the previous stage (for example, at a substantially central portion in the unit laminate 16). Thereby, the wave function of the non-linear level $L_{NL}$ can be easily set not to reach the injection barrier layer B1 of the light emission layer 17. As a result, injection of electrons from the injection layer 18 of the unit laminate 16 in the previous stage to the non-linear level $L_{NL}$ of the unit laminate 16 in the subsequent stage can be effectively suppressed.

Next, a radiation angle (Cherenkov radiation angle) $\theta_C$ of the terahertz wave generated by the above-described active layer 31 will be described. Here, a case in which the first pump light and the second pump light are mid-infrared light, a frequency range of the terahertz wave is 1 THz to 6 THz, and the semiconductor substrate 2 is an InP single crystal substrate will be taken as an example. In this case, as illustrated by arrows A1 in FIG. 2, terahertz waves generated by the difference-frequency generation are transmitted as plane waves (that is, in the same phase as each other) in the semiconductor substrate 2 at a radiation angle $\theta_C$ (angle with respect to the resonance direction A0) expressed by the following expression (4). In expression (4), $n_{MIR}$ is a refractive index of the InP single crystal substrate (the semiconductor substrate 2) with respect to mid-infrared light (the first pump light and the second pump light), and $n_{THz}$ is a refractive index of the InP single crystal substrate (the semiconductor substrate 2) with respect to the terahertz waves.

$$\theta_C = \cos^{-1}(n_{MIR}/n_{THz}) \qquad (4)$$

[Method of Manufacturing Quantum Cascade Laser]

An example of a method of manufacturing the QCL 10 will be described. First, 200 nm of high-concentration Si-doped InGaAs (Si: $1.0 \times 10^{18}$ cm$^{-3}$) as the lower contact layer 37, 5 μm of Si-doped InP (Si: $1.5 \times 10^{16}$ cm$^{-3}$) as the lower clad layer 35, and 250 nm of Si-doped InGaAs (Si: $1.5 \times 10^{16}$ cm$^{-3}$) as the lower guide layer 33 are grown on a semi-insulating InP substrate (the semiconductor substrate 2). Next, the active layer 31 is formed by laminating the above-described unit laminate 16 for, for example, 50 cycles. The active layer 31 is formed by epitaxially growing an InGaAs quantum well layer and an InAlAs barrier layer, which are lattice-matched with InP, in sequence using, for example, a molecular beam epitaxy (MBE) method, a metal-organic chemical vapor deposition (MOCVD) method, or the like. Next, 350 nm of Si-doped InGaAs (Si: $1.5 \times 10^{16}$ cm$^{-3}$) is provided on the active layer 31 as the upper guide layer 32 that also serves as the DFB diffraction grating layer, and a diffraction grating (the diffraction grating layers 32a and 32b) with a depth of, for example, 250 nm is formed by etching. After the diffraction grating is formed, a ridge stripe having a width of, for example, 12 µm is formed in a direction (Y-axis direction) perpendicular to a periodic structure of the diffraction grating. Then, a Fe-doped InP layer (the support layer 38) is buried and regrown on both sides of the lower guide layer 33, the active layer 31, and the upper guide layer 32 in the width direction (Y-axis direction) using a metal-organic chemical vapor deposition method or the like. Next, the upper clad layer 34 is formed by growing 5 µm of Si-doped InP (Si: $1.5 \times 10^{16}$ cm$^{-3}$), and high-concentration Si-doped InP (Si: $1.5 \times 10^{18}$ cm$^{-3}$) is further grown to form the upper contact layer 36. Next, the InGaAs contact layer (the lower contact layer 37) on the semiconductor substrate 2 side is exposed by etching, and then the insulating film 4 is formed using SiN or the like. Next, a contact hole (the contact hole 4a or the like) is formed in the insulating film 4 in accordance with the upper and lower InGaAs contact layers (the upper contact layer 36 and the lower contact layer 37), a thick Au film (thickness of about 5 µm) is formed using a deposition method and a plating method, and thereby an electrode is formed. Finally, the Au is etched so that the electrode is separated into upper and lower electrodes (the upper electrode 5 and the lower electrode 6). As described above, the QCL 10 serving as a quantum cascade laser device can be obtained.

Effects

As described above, in the QCL 10, a separation layer 19 is provided between the light emission layer 17 and the injection layer 18 in each unit laminate 16 constituting the active layer 31. As shown in FIGS. 5 and 6, the separation layer 19 includes the separation quantum well layer Q6 having a layer thickness smaller than the average layer thickness of the quantum well layers Q1 to Q5 included in the light emission layer 17 and the average layer thickness of the quantum well layers Q7 to Q13 included in the injection layer 18. According to such a separation quantum well layer Q6, the non-linear level $L_{NL}$ that contributes to the non-linear optical effect can be formed in the subband level structure due to the quantum well structure of the unit laminate 16. Also, since an injection amount of carriers (electrons) from the injection layer 18 of the unit laminate 16 in the previous stage into the non-linear level $L_{NL}$ is relatively small, the number of carriers of the non-linear level $L_{NL}$ can be reduced to be small. As a result, a threshold current density required for laser oscillation in the active layer 31 can be reduced as compared with the conventional DAU structure in which electrons are actively injected into both of the two upper light emission levels.

The unit laminate 16 is configured to generate light having the first frequency $\omega_1$ and light having the second frequency $\omega_2$ which are mid-infrared light and a terahertz wave having the difference frequency $\omega_{THz}$ between the first frequency $\omega_1$ and the second frequency $\omega_2$ using the double resonant process in which the upper light emission level $L_{up}$, the lower light emission level $L_{low}$, and the non-linear level $L_{NL}$ resonate. According to the above-described configuration, the terahertz wave can be generated with a relatively high mid-infrared-terahertz conversion efficiency (the second-order non-linear susceptibility $\chi^{(2)}$ while achieving reduction in threshold current density by forming the non-linear level $L_{NL}$ described above.

For example, when continuous oscillation is performed with the QCL 10, a temperature of the QCL 10 rises because a current is always applied to the QCL 10. Due to this, a threshold current density for laser oscillation also increases. Therefore, reduction in threshold current density is particularly required in THz-QCL that performs continuous laser oscillation. As described above, according to the QCL 10, similarly to the conventional DAU structure, a relatively high second-order non-linear susceptibility $\chi^{(2)}$ can be realized by forming two levels (the upper light emission level $L_{up}$ and the non-linear level $L_{NL}$) having higher energies than the lower light emission level $L_{low}$. Further, since electrons are hardly injected from the unit laminate 16 in the previous stage into one (the non-linear level $L_{NL}$) of the two upper levels, the threshold current density can be reduced as compared with that in the conventional DAU structure. Therefore, according to the QCL 10, the threshold current density is reduced while maintaining a relatively high mid-infrared-terahertz conversion efficiency (that is, relatively high second-order non-linear susceptibility $\chi^{(2)}$, and thereby a continuous operation at room temperature can be performed.

EXAMPLE

Figure 7:
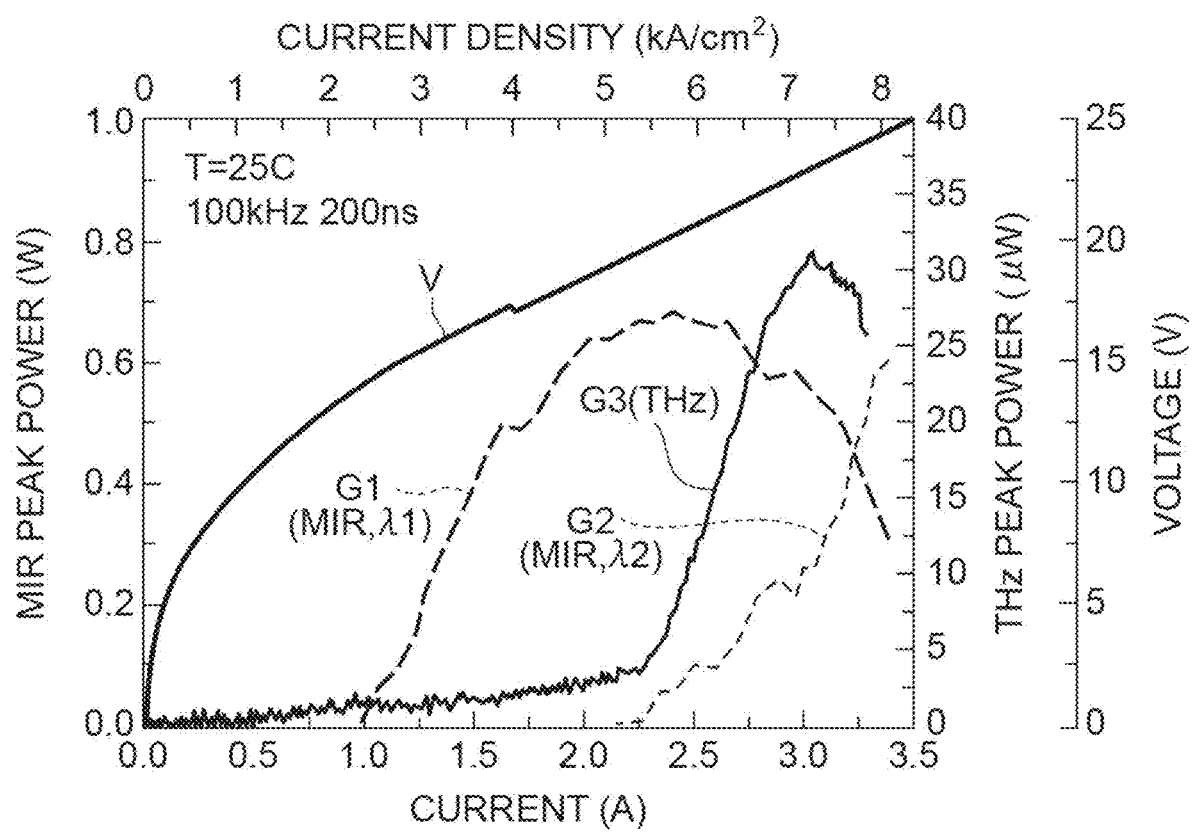
FIG. 7 is a graph showing current-light output characteristics of the quantum cascade laser.

FIG. 7 is a graph showing current-light output characteristics for mid-infrared (MIR) light and a terahertz (THz) wave measured for the QCL 10 according to an example. In this graph, the horizontal axis represents a current (A) or a current density (kA/cm$^2$), and the vertical axis represents peak power (W) of the MIR light or peak power (µW) of the THz wave. Measurement was performed using a Golay cell of a THz detector after concentrating light generated from the QCL 10 with two parabolic mirrors in an environment purged with nitrogen at room temperature (25° C.). The QCL 10 was driven with a repetition frequency of 100 kHz and a pulse width of 200 ns, and a signal thereof was detected by a lock-in amplifier.

In FIG. 7, graph G1 shows a current dependence of peak power of the MIR light of a first wavelength $\lambda_1$ corresponding to the first frequency $\omega_1$. Graph G2 shows a current dependence of peak power of the MIR light of a second wavelength $\lambda_2$ corresponding to the second frequency $O_2$. Graph G3 shows a current dependence of peak power of the terahertz wave generated by the difference-frequency generation. As shown in FIG. 7, in the QCL 10 according to the example, a threshold current density of 2.2 kA/cm$^2$ which was relatively low with respect to the MIR light was ascertained. Specifically, it was ascertained that the threshold current density could be reduced to the same extent as that in, for example, a bound-to-continuum structure. Also, a total peak output of the MIR light reached about 1 W, and it was ascertained that a higher MIR-QCL performance could be obtained compared to that in a conventional active layer structure. Regarding an output of the terahertz wave, peak power of about 32 µW was ascertained. That is, it was ascertained that a threshold current density lower than that in the DAU structure could be realized while realizing mid-infrared-terahertz conversion efficiency equivalent to that of the conventional DAU structure.

Modified Example

Although one embodiment of the present disclosure has been described above, the present disclosure is not limited to the above-described embodiment.

For example, instead of two types of the diffraction grating layers 32a and 32b, one type of diffraction grating layer may be provided in the semiconductor layer 3, or three or more types of diffraction grating layers may be provided in the semiconductor layer 3. The diffraction grating layer that functions as the distributed feedback structure may be any diffraction grating layer as long as it oscillates at least one of the first pump light and the second pump light in a single mode. Also, instead of the diffraction grating layer that functions as the distributed feedback structure, a configuration that utilizes the difference-frequency generation having a configuration in which an oscillation spectrum width extends to 1 THz or more in the Fabry-Perot operation may be used. In such a configuration, although an output of terahertz light is low compared to the diffraction grating layer functioning as the distributed feedback structure, a wideband THz spectrum can be obtained.

Also, the active layer 31 is not limited to the configuration including only one type of unit laminate 16 illustrated in FIGS. 4 to 6 and may include two or more types of active layer structures (unit laminates).

Also, the semiconductor substrate 2 is not limited to the semi-insulating InP single crystal substrate, and may be, for example, an undoped InP single crystal substrate (cc (carrier concentration): up to $5 \times 10^{15}/cm^3$), a low-doped InP single crystal substrate (Si: $5 \times 10^{15}$ to $1 \times 10^{7}/cm^3$), or the like. In this case, the lower electrode can be formed on the back surface side of the semiconductor substrate. However, when a doping concentration of the semiconductor substrate is increased, since light absorptivity inside the substrate is increased, extraction efficiency of the terahertz wave decreases. Therefore, from a viewpoint of reducing an absorption loss of output light in the semiconductor substrate, the semiconductor substrate is preferably a semi-insulator substrate which is not doped with impurities as in the above-described embodiment. Also, the semiconductor substrate 2 may be a substrate other than the InP substrate, and may be, for example, a silicon single crystal substrate.

Also, in the above-described embodiment, the active layer 31 having a configuration that is lattice-matched with the InP single crystal substrate has been exemplified, but the active layer 31 may be one using a configuration in which distortion compensation is introduced. Also, the semiconductor material system of the active layer 31 is not limited to the above-described InGaAs/InAlAs, and various semiconductor material systems such as, for example, GaAs/AlGaAs, InAs/AlSb, GaN/AlGaN, and SiGe/Si can be applied. Also, various methods can be applied to the semiconductor crystal growth method.

Also, in the above-described embodiment, the non-linear level $L_{NL}$ is formed on a higher energy side than the upper light emission level $L_{up}$ in the subband level structure of the unit laminate 16, but the non-linear level $L_{NL}$ may be formed on a lower energy side than the upper light emission level $L_{up}$. That is, a magnitude relation between the first frequency $\omega_1$ and the second frequency $\omega_2$ may be opposite to that of the above-described embodiment ($\omega_1 < \omega_2$).

Also, the QCL 10 is not limited to the terahertz light source that generates a terahertz wave due to the difference-frequency generation and may be configured as a mid-infrared light source that generates only mid-infrared (MIR) light. That is, the structure of the active layer 31 (structure having the separation layer 19) described above may be applied to a QCL serving as a mid-infrared light source that generates only mid-infrared (MIR) light.

Also, in the above-described embodiment, the separation layer 19 is formed by one quantum well layer and two barrier layers positioned on both sides of the quantum well layer, but the separation layer 19 may be formed by two or more separation quantum well layers and three or more barrier layers. When the separation layer 19 includes a plurality of separation quantum well layers, each of the plurality of separation quantum well layers included in the separation layer 19 may contribute to formation of the non-linear level. Also, in this case, the "layer thickness of the separation quantum well layer" described in the above-described embodiment may be rephrased as an average value of layer thicknesses of the plurality of separation quantum well layers included in the separation layer 19.

EXPLANATION OF REFERENCES

1 Laser module
2 Semiconductor substrate (substrate)
10 QCL (quantum cascade laser)
16 Unit laminate
17 Light emission layer
18 Injection layer
19 Separation layer
B1 Injection barrier layer (barrier layer)
B6, B7 Separation barrier layer (barrier layer)
B2 to B5, B8 to B13 Barrier layer
$L_{up}$ Upper light emission level
$L_{low}$ Lower light emission level
$L_{NL}$ Non-linear level
$L_r$ Relaxation level (low level)
Q6 Separation quantum well layer (quantum well layer)
Q1 to Q5, Q7 to Q13 Quantum well layer

What is claimed is:

1. A quantum cascade laser comprising:
   a substrate; and
   an active layer provided on the substrate, wherein
   the active layer has a cascade structure in which a unit laminate including a light emission layer which generates light and an injection layer to which electrons are transported from the light emission layer is laminated in multiple stages,
   the light emission layer and the injection layer each have a quantum well structure in which quantum well layers and barrier layers are alternately laminated,
   a separation layer including a separation quantum well layer which is the quantum well layer having a layer thickness smaller than an average layer thickness of the quantum well layers included in the light emission layer and smaller than an average layer thickness of the quantum well layers included in the injection layer is provided between the light emission layer and the injection layer in the unit laminate, and
   the unit laminate includes an upper light emission level, a lower light emission level, and a non-linear level due to a ground level of the separation quantum well layer in a subband level structure due to the quantum well structure.

2. The quantum cascade laser according to claim 1, wherein the layer thickness of the separation quantum well layer is smaller than a layer thickness of a first quantum well layer adjacent to the separation quantum well layer among the quantum well layers included in the light emission layer and smaller than a layer thickness of a second quantum well layer adjacent to the separation quantum well layer among the quantum well layers included in the injection layer.

3. The quantum cascade laser according to claim 2, wherein the layer thickness of the separation quantum well layer is ½ or less of the layer thickness of the first quantum well layer and ½ or less of the layer thickness of the second quantum well layer.

4. The quantum cascade laser according to claim 1, wherein an energy spacing between the upper light emission level and the non-linear level is set to be smaller than an energy $E_{LO}$ of longitudinal optical phonons.

5. The quantum cascade laser according to claim 1, wherein an anticrossing gap between a low level which is the lowest energy level in a first unit laminate, which is the unit laminate, and the upper light emission level in a second unit laminate which is the unit laminate disposed in a subsequent stage of the first unit laminate is set to be larger than an anticrossing gap between the low level and the non-linear level in the second unit laminate.

6. The quantum cascade laser according to claim 1, wherein the separation quantum well layer is formed by any of the fourth to sixth quantum well layers counted from the quantum well layer at the head in the unit laminate.

7. The quantum cascade laser according to claim 1, wherein the unit laminate is configured to generate light having a first frequency $\omega_1$ and light having a second frequency $\omega_2$ which are mid-infrared light and a terahertz wave having a difference frequency $\omega_{THz}$ between the first frequency $\omega_1$ and the second frequency $\omega_2$ using a double resonant process in which the upper light emission level, the lower light emission level, and the non-linear level resonate.

8. The quantum cascade laser according to claim 1, wherein
the separation layer includes separation barrier layers which are the barrier layers disposed on both sides of the separation quantum well layer in a lamination direction of the unit laminate, and
layer thicknesses of the separation barrier layers are each smaller than an average layer thickness of the barrier layers included in the light emission layer and an average layer thickness of the barrier layers included in the injection layer.

9. The quantum cascade laser according to claim 1, wherein
the separation layer includes separation barrier layers which are the barrier layers disposed on both sides of the separation quantum well layer in a lamination direction of the unit laminate, and
layer thicknesses of the separation barrier layers are each smaller than a layer thickness of a first barrier layer adjacent to the separation barrier layers among the barrier layers included in the light emission layer and a layer thickness of a second barrier layer adjacent to the separation barrier layers among the barrier layers included in the injection layer.

\* \* \* \* \*